(12) United States Patent
Hourai et al.

(10) Patent No.: US 7,704,318 B2
(45) Date of Patent: Apr. 27, 2010

(54) SILICON WAFER, SOI SUBSTRATE, METHOD FOR GROWING SILICON SINGLE CRYSTAL, METHOD FOR MANUFACTURING SILICON WAFER, AND METHOD FOR MANUFACTURING SOI SUBSTRATE

(75) Inventors: Masataka Hourai, Tokyo (JP); Wataru Sugimura, Tokyo (JP); Toshiaki Ono, Tokyo (JP); Tadami Tanaka, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 10/546,600

(22) PCT Filed: Feb. 25, 2004

(86) PCT No.: PCT/JP2004/002239

§ 371 (c)(1),
(2), (4) Date: Aug. 23, 2005

(87) PCT Pub. No.: WO2004/083496

PCT Pub. Date: Sep. 30, 2004

(65) Prior Publication Data

US 2006/0156969 A1  Jul. 20, 2006

(51) Int. Cl.
*C30B 29/06* (2006.01)
(52) U.S. Cl. .............. 117/13; 117/31; 117/33; 117/54; 117/56; 117/931; 117/932
(58) Field of Classification Search .............. 117/19, 117/13, 34, 84, 89, 94, 37, 39, 43, 11, 30, 117/31, 33, 54, 56, 73, 74, 931, 932, 934; 428/446, 64.1
See application file for complete search history.

(56) References Cited

U.S. PATENT DOCUMENTS 5,705,425 A * 1/1998 Miura et al. ............. 438/106

(Continued)

FOREIGN PATENT DOCUMENTS

EP  0 890 662 A1  1/1999

(Continued)

OTHER PUBLICATIONS

Masashi Suezawa, "Div. Science and Technology of Crystals", Jpn. Soc. Appl. Phys., Text of Research Meeting No. 1100, p. 11 (Jun. 3, 1999).

(Continued)

*Primary Examiner*—Steven P Griffin
*Assistant Examiner*—Seyed Masoud Malekzadeh
(74) *Attorney, Agent, or Firm*—Pillsbury Winthrop Shaw Pittman, LLP

(57) ABSTRACT

When growing a silicon single crystal free of grown-in defects based on the CZ method, the crystal is pulled out at a critical pulling rate at which a ring-shaped OSF occurrence region vanishes in a center portion of the crystal by using a hot zone structure in which a temperature gradient Gc in a center portion of the crystal is equal to or greater than a temperature gradient Ge in a peripheral portion of the crystal, while supplying an inert gas including hydrogen to an interior of a pulling furnace. The critical pulling rate at which the ring-shaped OSF occurrence region vanishes in the center portion of the crystal is increased, and single crystals free of grown-in defects in which dislocation clusters and COPs can be grown by pulling at a pulling rate higher than that of the prior art.

2 Claims, 9 Drawing Sheets

U.S. PATENT DOCUMENTS

| | | | | |
|---|---|---|---|---|
| 5,918,136 | A * | 6/1999 | Nakashima et al. | 438/404 |
| 5,930,643 | A * | 7/1999 | Sadana et al. | 438/407 |
| 5,994,199 | A * | 11/1999 | Sugiyama | 438/404 |
| 6,074,928 | A * | 6/2000 | Ogura | 438/404 |
| 6,127,702 | A * | 10/2000 | Yamazaki et al. | 257/347 |
| 6,224,668 | B1 * | 5/2001 | Tamatsuka | 117/84 |
| 6,334,896 | B1 * | 1/2002 | Iida et al. | 117/20 |
| 6,514,335 | B1 * | 2/2003 | Egashira et al. | 117/13 |
| 6,544,490 | B1 * | 4/2003 | Takeno et al. | 423/328.2 |
| 6,569,535 | B2 * | 5/2003 | Murakami et al. | 428/446 |
| 6,599,360 | B2 * | 7/2003 | Iida et al. | 117/19 |
| 6,676,748 | B1 * | 1/2004 | Himi et al. | 117/8 |
| 6,843,848 | B2 * | 1/2005 | Von Ammon et al. | 117/19 |
| 7,141,113 | B1 * | 11/2006 | Nakamura et al. | 117/3 |
| 7,291,055 | B2 * | 11/2007 | Tsuchiya | 451/5 |
| 7,435,294 | B2 * | 10/2008 | Ono et al. | 117/13 |
| 2001/0012649 | A1 * | 8/2001 | Yoshida et al. | 438/149 |
| 2001/0019153 | A1 * | 9/2001 | Sato et al. | 257/347 |
| 2001/0039098 | A1 * | 11/2001 | Lu | 438/407 |
| 2002/0081440 | A1 * | 6/2002 | Murakami et al. | 428/446 |
| 2002/0139294 | A1 * | 10/2002 | Falster et al. | 117/13 |
| 2002/0139298 | A1 | 10/2002 | Okui et al. | |
| 2003/0013280 | A1 * | 1/2003 | Yamanaka | 438/487 |
| 2003/0015131 | A1 * | 1/2003 | Iida et al. | 117/14 |
| 2003/0082887 | A1 * | 5/2003 | Hughes et al. | 438/404 |
| 2003/0087503 | A1 * | 5/2003 | Sakaguchi et al. | 438/406 |
| 2003/0087504 | A1 * | 5/2003 | Erokhin et al. | 438/407 |
| 2003/0094627 | A1 * | 5/2003 | Ootsuka et al. | 257/196 |
| 2003/0106484 | A1 * | 6/2003 | Fusegawa et al. | 117/19 |
| 2003/0140843 | A1 * | 7/2003 | Kanda et al. | 117/2 |
| 2003/0148595 | A1 * | 8/2003 | Yoshida et al. | 438/517 |
| 2003/0194846 | A1 * | 10/2003 | Hovel et al. | 438/400 |
| 2004/0014302 | A1 * | 1/2004 | Tolchinsky et al. | 438/514 |
| 2004/0097102 | A1 * | 5/2004 | Mun et al. | 438/795 |
| 2004/0171228 | A1 * | 9/2004 | Matsumura et al. | 438/407 |

FOREIGN PATENT DOCUMENTS

| | | |
|---|---|---|
| EP | 0 964 082 A1 | 12/1999 |
| JP | 61-178495 | 8/1986 |
| JP | 11-157995 A1 | 6/1999 |
| JP | 11-189495 | 7/1999 |
| JP | 11238885 A * | 8/1999 |
| JP | 2000-68489 A | 3/2000 |
| JP | 2000-281491 * | 10/2000 |
| JP | 2000-281491 A | 10/2000 |
| JP | 2001-220289 A | 8/2001 |
| JP | 2001-335396 A | 12/2001 |
| JP | 2002-187794 A | 7/2002 |

OTHER PUBLICATIONS

E. Lino et al., "Cavities owing to hydrogen in Si single crystals grown by continuously charging CZ method", Materials Science and Engineering, B36, pp. 146-149 (1996).

T.H. Wang et al., "Charge carrier recombination centers in high-purity, dislocation-free, float-zoned silicon due to growth-induced microdefects", Journal of Crystal Growth 109, pp. 155-161 (1991).

Yoshimitsu Sugita, "X-Ray Observations of Defect Structures in Silicon Crystals", Japanese Journal of Applied Physics, vol. 4, No. 12 (Dec. 1965).

Notice of Reasons for Rejection for Japanese Application No. 2005-208525 dated Sep. 8, 2009.

* cited by examiner

SILICON WAFER, SOI SUBSTRATE, METHOD FOR GROWING SILICON SINGLE CRYSTAL, METHOD FOR MANUFACTURING SILICON WAFER, AND METHOD FOR MANUFACTURING SOI SUBSTRATE

CROSS REFERENCE TO RELATED APPLICATIONS

This is the U.S. National Phase of PCT/JP2004/002239, filed Feb. 25, 2004, which in turn claims priority to Japanese Patent Application No. 2003-047565, filed on Feb. 25, 2003, both of which are incorporated herein in their entirety by reference.

TECHNICAL FIELD

The present invention relates to a silicon wafer which is a material for semiconductor devices, a method for manufacturing the same, and a method for growing a silicon single crystal which is a material for silicon wafers.

BACKGROUND ART

A rotational pulling method known as the CZ method is representative of methods for manufacturing silicon single crystals which are materials for silicon wafers. As is well known, in the manufacture of silicon single crystals by the CZ method, a seed crystal is immersed in a silicon melt formed in a quartz crucible, and while rotating both the crucible and the seed crystal, the seed crystal is pulled upward so as to grow a silicon single crystal below the seed crystal.

It is known that in silicon single crystals manufactured in this way, there occur various types of grown-in defects which cause problems for device formation processes. Two representative types of grown-in defects are dislocation clusters which occur in interstitial-silicon-dominant regions, and COPs or voids which occur in vacancy-dominant regions. Between these two regions is a ring-shaped OSF occurrence region. There are also vacancy type and interstitial-silicon type grown-in-defect-free regions. A representative defect distribution in a crystal radial direction is explained below using FIG. 1.

A ring-shaped OSF occurrence region exists in a ring shape at an intermediate position in a crystal radial direction. On an inside of the ring-shaped OSF occurrence region there is a COP or void occurrence region with a defect-free region intervening therebetween. On the other hand, on an outside of the ring-shaped OSF occurrence region there is a dislocation cluster occurrence region with an oxygen precipitation promotion region and an oxygen precipitation suppression region intervening therebetween. The oxygen precipitation promotion region is the vacancy type grown-in-defect-free region; the oxygen precipitation suppression region is the interstitial-silicon type grown-in-defect-free region.

Such a defect distribution is known to be controlled by the following two factors. The one is a pulling rate for the crystal; the other is a temperature distribution within the crystal immediately after solidification. Effects of the pulling rate for the crystal is explained as follows, using FIG. 2.

FIG. 2 shows a defect distribution in a vertical cross-section of a single crystal which is grown while gradually lowering the pulling rate. In a stage in which the pulling rate is higher, the ring-shaped OSF occurrence region is positioned in an outer circumference of the crystal. Therefore, in a wafer cut from a single crystal grown at a high pulling rate, COPs occur substantially in the entire radial direction of the crystal. As the pulling rate is lowered, the ring-shaped OSF occurrence region gradually moves toward a center portion of the crystal, and finally vanishes in the center portion of the crystal. Therefore, in a wafer cut from a single crystal grown at a low pulling rate, dislocation clusters occur substantially in the entire radial direction of the crystal. It should be noted that the crystal lateral cross-section of FIG. 1 corresponds to a cross-sectional view at position A in FIG. 2.

Both of dislocation clusters and COPs are harmful grown-in defects which worsen device characteristics, however COPs are comparatively less harmful. Due to this and demands related to productivity, in the prior art, crystals are mainly grown at a high pulling rate for making the OSF occurrence region be situated on the outer circumference of the wafer or removing the OSF occurrence region outside the crystal, as indicated by a position at D or above in FIG. 2.

However, with marked trend toward miniaturization of integrated circuits in recent years, it begins to be noticed that COPs are harmful as well, and the need arises to prevent the occurrence of COPs as well as dislocation clusters. Technologies devised in response to this demand are to grow defect-free crystals by controlling point defect distributions, as described in Japanese Patent Application, First Publication No. 2001-220289 and Japanese Patent Application, First Publication No. 2002-187794.

Growth of crystals free of grown-in defects described in Japanese Patent Application, First Publication No. 2001-220289 and Japanese Patent Application, First Publication No. 2002-187794 utilize the phenomenon in which the defect distribution is controlled through the temperature distribution within the crystal immediately after solidification as described above.

That is, in a normal CZ method for pulling the crystal, beat is radiated from an outer surface immediately after solidification. Consequently, the axial-direction temperature gradient within the crystal immediately after solidification is such that a temperature gradient Ge in a peripheral portion tends to be greater than a temperature gradient Gc in a center portion. As a result, in a vertical cross-section of a single crystal grown by gradually lowering the pulling rate, the defect distribution, in particular the ring-shaped OSF occurrence region has a V-shape of convex downward with a pointed tip. As a result, even if the crystal is pulled at or in a vicinity of a critical pulling rate at which the ring-shaped OSF occurrence region vanishes in the center portion of the crystal, the grown-in-defect-free region is merely limited to the center portion of the crystal, and defects cannot be eliminated from all portions in the crystal radial direction.

It should be noted that while dislocation clusters and COPs do not occur in the defect-free region on the inside of the ring-shaped OSF occurrence region, dislocation clusters and COPs also do not occur in the ring-shaped OSF occurrence region itself, nor in the oxygen precipitation promotion region and the oxygen precipitation suppression region on the outer side. That is, these four regions are all grown-in-defect-free regions.

On the other hand, in the case in which the temperature of the crystal immediately after solidification, especially the outer surface thereof, is maintained in a positive manner by an improvement of a hot-zone structure in a crystal pulling furnace, the temperature gradient Gc in the center portion can be made equal to or greater than the temperature gradient Ge in the peripheral portion. Then in the vertical cross-section of a single crystal grown by gradually reducing the pulling rate, the shape of the OSF occurrence region still remains convex downward while the tip thereof being flattened, thereby the shape becomes a U-shape as shown in FIG. 3. In this state, by adopting pulling conditions to be at or in the vicinity of the critical pulling rate at which the OSF occurrence region vanishes in the center portion of the crystal, the entire portion in the crystal radial direction can be made defect-free. In FIG. 3, these conditions for pulling the crystal are within the B-C range.

Other technology for growth of crystals free of grown-in defects is hydrogen doping during pulling the crystal, as described in Japanese Unexamined Patent Application, First Publication No. 2000-281491 and Japanese Patent Application, First Publication No. 2001-335396. In these technologies, small amounts of hydrogen gas are intermixed with an inert gas fed into the pulling furnace, and the formation of vacancy defects can be suppressed as is the case with nitrogen doping of the silicon melt.

In the technologies to grow crystals free of grown-in defects by controlling the defect distribution, such as those disclosed in Japanese Patent Application, First Publication No. 2001-220289 and Japanese Patent Application, First Publication No. 2002-187794, it is necessary to choose, as the pulling conditions, low-pulling-rate conditions to be at or in the vicinity of the critical pulling rate at which the OSF occurrence region vanishes in the center portion of the crystal. Consequently, reduced productivity cannot be avoided.

In addition, a range of pulling rate (the margin; the range B-C in FIG. 3) for growing crystals free of grown-in defects is narrow, and it is difficult to grow a crystal free of grown-in defects stably. Consequently, it is difficult to obtain a crystal free of grown-in defects throughout the entire length of the crystal, thereby the production yield for the crystals free of grown-in defects is reduced. Hence there has been the problem that manufacturing costs of the crystals free of grown-in defects cannot easily be lowered. In particular, as the crystal diameter is increased to 200 mm and 300 mm, it becomes difficult to satisfy a condition of $Ge \leqq Gc$, and the range of pulling rate B-C for growing defect-free crystals tends to be even more narrow. Hence some breakthrough technique to circumvent such problems has been sought, On the other hand, SOI (Silicon on Insulator) substrates enable semiconductor devices which operate faster and consume less power, and are hereafter expected to be in greater demand.

Major methods for manufacturing the SOI substrates include a bonding method in which a wafer with an oxide film is bonded to a normal wafer, and a SIMOX (Separation by Implanted Oxygen) method in which a buried oxide (BOX) layer is formed by implanting oxygen ions following by oxidation at a high temperature of 1300° C. or higher.

MOSFETs (Metal Oxide Semiconductor Field Effect Transistors) formed on SOI layers in these SOI substrate have high radiation resistance and high latch-up resistance, and in addition to exhibiting high reliability, short-channel effects accompanying device miniaturization can be suppressed, and a low power consumption can be realized. Hence SOI substrates are regarded as high-functionality semiconductor substrates for use in next-generation MOS LSI devices. However, manufacturing processes are complex compared with those for ordinary wafers, and manufacturing costs tend to be higher, leading to strong demands for low-cost technologies.

The SIMOX substrate must be free of COPs inherently. That is, in the case in which oxygen ions are implanted in a substrate containing COPs, because COP areas are cavities, oxygen ions are scattered or arc implanted more deeply than in normal areas. Thereby, when the SIMOX substrate is annealed, irregularities Occur in the buried oxide (BOX) layer. For this reason, wafers are used for SIMOX substrates in which COPs are eliminated from a vicinity of a surface by an epitaxial growth or a high-temperature treatment in a hydrogen or argon atmosphere. But because the epitaxial growth, the high-temperature annealing, or some other additional processes are needed, there is a problem of high manufacturing costs.

With regard to the bonded SOI substrate, in the case in which COPs exist in a substrate positioned on an active-layer side, when manufacturing a thin film bonded SOI wafer having an active layer of 0.1 μm or less, areas containing COPs in the active layer becomes thinner. Thereby, the areas become pinholes which penetrate partially or completely through to the BOX layer, resulting in so-called HF defects and other faults. Consequently, it is necessary to use a wafer not containing COPs as the substrate on the active-layer side. Of course the same holds for a thick film bonded SOI having an active layer of greater than 0.1 μm, and in the case in which the active layer contains COPs, gate oxide integrity and device resistance separation become faulty. Therefore it is desirable that a wafer free of COPs be used as the active-layer side substrate.

From the above, because crystals free of grown-in defects are inherently free of COPs, when used as SOI substrates, there is no need for such additional processes as the epitaxial growth and the high-temperature annealing. Therefore, such crystals are promising for use as SOI substrates for which lower costs are demanded. However as explained above, the crystal free of grown-in defects is grown by pulling at a lower rate than that in the normal CZ method, and the range of pulling rate (margin) for growing crystals free of grown-in defects is exceedingly narrow. Therefore, production yields are low, and consequently it is difficult to reduce manufacturing costs of the crystal.

In order to solve these problems, it is necessary to raise the pulling rate so as to improve productivity, and further it is necessary to expand the range of pulling rate (margin) for growing crystals free of grown-in defects so as to stabilize crystal growth and improve production yields.

An object of the present invention is to provide a method for growing a silicon single crystal by which crystals free of grown-in defects are stably grown with good productivity in order to provide wafers that can be used as mirror-polished wafers or SOI wafers. Another object of the present invention is to provide a mirror-polished silicon wafer or a SOI wafer manufactured using such a method for growing a silicon single crystal and having high quality and low manufacturing costs, and methods for manufacturing the same.

DISCLOSURE OF THE INVENTION

With the object of improving productivity and production yields which have been problems in technologies to grow defect-free crystals by controlling defect distributions, the inventors focused on hydrogen doping techniques, and as a result of studies, arrived at the following two conclusions.

First, when a single crystal is grown while gradually lowering a pulling rate, a hot-zone structure is used in which a temperature gradient Gc in a center portion of the crystal is equal to or greater than a temperature gradient Ge in a peripheral portion of the crystal so as to obtain a crystal of which a vertical cross-section has an OSF occurrence region of a U-shape. In this case, if small amount of hydrogen gas is intermixed with an inert gas fed into a pulling furnace, the defect distribution in the vertical cross-section of the crystal is such that a range of pulling rate B'-C' for growing defect-free crystals shown in FIG. 4 is expanded in a crystal axis direction compared with a range B-C in FIG. 3 in a crystal obtained by doping no hydrogen.

Second, this expansion of the range of pulling rate is realized by an increase in a critical pulling rate Vo at which a ring-shaped OSF occurrence region vanishes in the center portion of the crystal and a lowering of a critical pulling rate Vd at which dislocation clusters occur. That is, compared with the range B-C in FIG. 3 in the crystal obtained by doping no hydrogen, the range of pulling rate B'-C' for growing defect-free crystals is expanded toward a higher pulling-rate side that is upward in FIG. 3, and is also expanded toward a lower pulling-rate side that is downward in FIG. 3. This phenomenon may be explained using FIG. 5 as follows.

FIG. 5 shows a degree of influence of the defect distribution on a relation between the pulling rate and the OSF ring diameter. In the figure, the broken line represents a case in which the temperature gradient Gc in the center portion of the crystal is smaller than the temperature gradient Ge in the peripheral portion of the crystal; that is, in this case the shape of the OSF occurrence region in the vertical cross-section of a single crystal grown by gradually lowering the pulling rate is a V shape and convex downwards. In this case, as the pulling rate is reduced, the OSF ring diameter gradually shrinks, converging on 0 at the critical pulling rate Vo.

The solid (thin) line represents a case in which the temperature gradient Gc in the center portion of the crystal is equal to or greater than the temperature gradient Ge in the peripheral portion of the crystal, that is, the shape of the OSF occurrence region in a vertical cross-section of a single crystal grown while gradually lowering the pulling rate is a U shape, and no hydrogen is doped. In this case, a pulling rate at which the OSF ring diameter begins to shrink is lowered, and the diameter begins to shrink rapidly from this beginning pulling rate, converging on a diameter of 0 at substantially the same critical pulling rate Vo as in the case of the broken line. That is, a rate of decrease of the ring diameter becomes steep, with the critical pulling rate Vo remaining constant. As a result, at or in the vicinity of the critical pulling rate Vo, a defect-free single crystal is grown with no dislocation clusters nor COPs over an entire crystal radial direction. However, since the critical pulling rate Vo is not increased, low-pulling-rate conditions remain necessary.

On the other hand, the solid (thick) line represents a case in which the temperature gradient Gc in the center portion of the crystal is equal to or greater than the temperature gradient Ge in the peripheral portion of the crystal, that is, the shape of the OSF occurrence region in a vertical cross-section of a single crystal grown while gradually lowering the pulling rate is U-shaped, and hydrogen is doped. Compared with the (thin) solid line, in this case, the critical pulling rate Vo rises to Vo' while the rate of decrease of the ring diameter remains steep. That is, the characteristic described by the thin solid line has undergone parallel displacement toward the higher pulling-rate side to result in the thick solid line.

By thus combining hydrogen doping with the growth of grown-in defect-free crystals, the critical pulling rate at which the ring-shaped OSF occurrence region vanishes in the center portion of the crystal is increased, and consequently it is possible to grow single crystals free of grown-in defects and in which dislocation clusters and COPs do not exist over the entire radial direction of the as-grown crystal, while pulling up at a pulling rate higher than that in the prior art. Furthermore, by doping hydrogen, the lower-limit of the pulling rate Vd at which dislocation clusters occur is reduced to Vd', so that the range of pulling rate for growing defect-free crystals is broadened from B-C to B'-C". Consequently defect-free crystals can be grown with good stability, and the production yield for crystals free of grown-in defects is markedly improved.

The reason for the expansion of the range of pulling rate for growing defect-free crystals by adoption of hydrogen doping, that is, the reason for the increase in the critical pulling rate Vo for the ring-shaped OSF and the decrease in the critical pulling rate Vd for the occurrence of dislocation clusters, is thought to be as follows.

When a silicon wafer is heat-treated at 1300 to 1390° C. in high-temperature hydrogen and then quenched, the hydrogen reacts with vacancies or interstitial silicons to form vacancy-hydrogen or interstitial silicon-hydrogen complexes (Reference 1: Masashi Suezawa, Jpn. Soc. Appl. Phys., Div. Science and Technology of Crystals, Text of Research Meeting No. 1100, Jun. 3, 1999, p. 11). Hence when a CZ crystal is grown in an inert atmosphere containing hydrogen, during a cooling process for the crystal, at a temperature of higher than that at which formation of COPs (approximately 1100° C.), dislocation clusters (approximately 1000° C.), and other grown-in defects occur, the hydrogen reacts with vacancies or interstitial silicons existing in excess in the silicon crystal so that vacancy-hydrogen, interstitial silicon-hydrogen, or other complexes are formed. Consequently, the concentrations of the vacancies and the interstitial silicons are lowered. As a result, the condensations of the vacancies and the interstitial silicons are suppressed, and a CZ crystal can be grown in which there are no COPs nor dislocation clusters or there are only small COPs and dislocation clusters.

However, when a CZ crystal is grown under vacancy-dominant conditions in which V/G is sufficiently large in an inert gas atmosphere containing hydrogen, if the hydrogen concentration is high, massive cavities ranging in size from several microns to several tens of microns (and thought to be aggregates of vacancies) which is called hydrogen defects are formed (Reference 2: E. Iino, K. Takano, M. Kimura, H. Yamagishi, Material Science and Engineering, B36 (1996), 146-149, and Reference 3: T. H. Wang, T. F. Ciszk, and T. Schuyler, J. Cryst. Growth, 109 (1991), 155-161). And, it is known that under interstitial-silicon-dominant conditions in which V/G is sufficiently small, interstitial-silicon-type hydrogen defects (dislocation pairs thought to be aggregates of interstitial silicons) are formed (Reference 4: Y. Sugita, Jpn. J. Appl. Phys., 4 (1965), p. 962).

Hence even if the pulling rate is not lowered to the critical pulling rate at which the ring-shaped OSF region occurs or lower, COP generation can be suppressed when the crystal is grown by the CZ method in an atmosphere containing a sufficient amount of hydrogen. However, due to the occurrence of the massive cavities the wafer cannot be used for semiconductor devices. Also, in the case in which the crystal is grown at a low pulling rate, the generation of dislocation clusters is suppressed, however the dislocation pairs occurs, thereby the wafer cannot be used for semiconductor devices.

FIG. 6 shows a relation between concentrations Cv and Ci of vacancies and interstitial silicons and a ratio V/G of a pulling rate V to a temperature gradient G on a crystal side in a vicinity of a solid-liquid interface in a center portion of a crystal during growing the crystal by the CZ method at 1100° C. or higher. In the figure, effects in suppressing the occurrence of COPs and dislocation clusters when hydrogen exists in the crystal are indicated. Reasons for suppressing the COPs and the dislocation clusters are explained using the figure. Here, Vo, Vc and Vd are critical pulling rates at which ring-shaped OSF region, COPs, and dislocation clusters begin to occur in a central portion of the crystal or in a part in a radial direction respectively. Cv-OSF, Cv-COP, and Ci-Disl represent critical point-defect concentrations for occurrences of the ring-shaped OSF region, the COPs, and the dislocation clusters, respectively.

When growing a crystal using a CZ furnace having a hot zone designed so that V/G satisfies Gc≧Ge in the crystal radial direction for growing a crystal free of grown-in defects, in the case in which the pulling rate is controlled to be higher than Vo (the case of [H2]=0 in FIG. 6), COPs generally occur and the COPs are point defects in which vacancies are predominant. However, in the case in which a CZ crystal is grown in an atmosphere containing hydrogen (H1, H2 in FIG. 6), vacancies and hydrogen atoms form complexes, so that concentration of free vacancies is reduced. This reduction in the concentration of free vacancies depends on the hydrogen concentration in the crystal, and the higher the hydrogen concentration, the greater is the reduction in the vacancy concentration. Hence when hydrogen exists, the pulling rate Vo at which the ring-shaped OSF occurs is shifted toward the high pulling-rate side, to Vo' and Vo", and the pulling rate Vc at which COPs are formed likewise is shifted toward higher pulling rates such as Vc'.

On the other hand, in the case in which the pulling rate is controlled to be lower than Vd (in the case of [H2]=0 in FIG. 6), point defects in which interstitial silicons are predominant occur, a concentration of the interstitial silicons is Ci>Ci-disl, and dislocation clusters generally occur as secondary defects of interstitial silicons. However, in the case in which the crystal is grown in an atmosphere containing hydrogen (the cases of [H2]=H1 or H2 in FIG. 6), the interstitial silicons and hydrogen form complexes, so that a concentration of free interstitial silicons is reduced. Hence pulling rate Vd for generating dislocation clusters at which the concentration matches the critical concentration Ci-disl is shifted to a lower pulling-rate side, to Vd' or Vd".

In the case in which the hydrogen concentration is relatively low, as the case of [H2]=H1 in FIG. 6, if V/G becomes sufficient large, the vacancy concentration becomes higher than the critical concentration Cv at which COPs occur. Therefore, an occurrence of COPs cannot be suppressed completely; however because the vacancy concentration is reduced compared with the case in which no hydrogen exists, a size of COPs becomes small.

In the case in which the hydrogen concentration is relatively high as the case of [H2]=H2 in FIG. 6, the vacancy concentration falls below Cv-COP, thereby there is no occurrence of COPs even when the pulling rate is increased to the extent possible.

In the case in which a pulling rate is equal to or less than the critical pulling rate Vo' or Vo" at which ring-shaped OSFs occur, and equal to or greater than the critical pulling rate Vd' or Vd" at which dislocation clusters occur, the concentrations of vacancies and interstitial silicons are sufficiently low, thereby there is no occurrence of COPs or dislocation clusters, and there is also no occurrence of vacancy-type hydrogen defects which are massive cavities or interstitial-silicon-type hydrogen defects which are dislocation pairs. And since a range of pulling rate (margin) at which crystals free of grown-in defects are grown is expanded prominently compared with the case in which no hydrogen is doped, defect-free crystals can be grown with stability and with high production yields.

In the case in which V/G is larger than but comparatively close to the critical condition of V/G at which the OSF ring closes, the ring-shaped OSF region does not close in the center portion of the crystal, and COPs occur in the inner region. However, because the vacancy concentration is reduced by the hydrogen doping, the size of COPs becomes small. In this case, since the vacancy concentration is also sufficiently low, massive cavities are not formed.

The present invention was accomplished on the basis of above knowledge; a silicon wafer of the present invention is a wafer of a silicon single crystal grown by the CZ method in an inert atmosphere including hydrogen, and in an as-grown state, that is, in a state of being pulled out and without heat-treated, the silicon wafer is either a wafer completely free of grown-in defects over an entire wafer thickness direction and over an entire crystal radial direction, or a wafer quasi free of grown-in defects in which COPs or voids having a size of 0.1 µm or smaller exist in at least a portion of the wafer in the crystal radial direction.

Of course in all such grown-in defect-free wafers in the as-grown state, the wafer does not include dislocation clusters over the entire wafer thickness direction and over the entire crystal radial direction.

A hydrogen concentration in a silicon single crystal when growing the silicon single crystal in an inert atmosphere containing hydrogen can be controlled by a hydrogen partial pressure in the atmosphere. When doping hydrogen into the crystal, hydrogen in the atmosphere is dissolved in the silicon melt to be a steady (equilibrium) state, and the hydrogen is allocated to a liquid phase and a solid phase by a concentration segregation during solidification.

From Henry's law, the hydrogen concentration in the melt depends on the hydrogen partial pressure in a gas phase, and is expressed as follows:

$$P_{H2}=kC_{LH2}.$$

Here, $P_{H2}$ is the hydrogen partial pressure in the atmosphere, $C_{LH2}$ is the hydrogen concentration in the silicon melt, and k is a coefficient relating the two.

On the other hand, the concentration in the crystal is determined by the relation between the concentration in the melt and segregation, and is expressed as follows:

$$C_{SH2}=k'C_{LH2}=(k'/k)P_{H2}.$$

Here, $C_{SH2}$ is the hydrogen concentration in the crystal, and k' is a segregation coefficient for hydrogen between the silicon melt and the crystal.

From the above, by controlling the hydrogen partial pressure in the atmosphere, the hydrogen concentration in the crystal immediately after solidification can be controlled to a constant desired concentration in the crystal axis direction.

A ring-shaped OSF occurrence region may exist in a portion of the crystal in the radial direction, or may have vanished in the center portion of the crystal.

A silicon wafer of the present invention can be used as a PW (Polished Wafer, mirror-polished wafer), and in addition can be used as a SIMOX type SOI wafer or as an active-layer side wafer for a bonded type SOI substrate.

Although not necessary in the case of the wafer completely free of grown-in defects which does not contain COPs over the entire crystal radial direction in the as-grown state, in the case of the wafer quasi free of grown-in defects which contains COPs with size limited to 0.1 µm or less, it is preferable that COPs be eliminated in a portion of the wafer from a surface to a depth of 1 µm or greater by subjecting the wafer to a COP-elimination annealing such as annealing at 1100 to 1200° C. for 1 hour or longer in hydrogen or argon.

A method for manufacturing a silicon single crystal of the present invention includes, when growing a silicon single crystal by the CZ method, pulling the crystal at or in a vicinity of a critical pulling rate at which a ring-shaped OSF occurrence region vanishes in a center portion of the crystal by using a hot-zone structure in which a temperature gradient Gc in a center portion of the crystal is equal to or greater than a temperature gradient Ge in a peripheral portion of the crystal, while supplying an inert gas including hydrogen to an interior of a pulling furnace.

Because vacancies trapped by hydrogen (hydrogen-vacancy complexes) subsequently cause reductions in a free energy of oxygen precipitate formation reaction, oxygen precipitation is promoted, and there is a possibility to form more massive cavities. Under growth conditions in which a pulling rate is higher than the critical pulling rate for occurrence of a ring-shaped OSF, the V/G is sufficiently great, thereby concentration of vacancies occurred during solidification becomes high. As a result precipitate nuclei which are stable at high temperatures are formed from hydrogen-vacancy complexes in which the vacancies are trapped by hydrogen. These may grow by a heat treatment during device fabrication and remain as stable precipitates in a vicinity of a surface layer, or OSFs may be generated during an oxidization heat treatment, resulting in a possibility to deteriorate device properties. In the case in which the V/G ratio is sufficiently large and the hydrogen concentration is also high, still larger massive cavities may occur; of course such a wafer is not appropriate as a wafer for semiconductor devices. In order to prevent occurrence of such stable oxygen precipitate nuclei and massive cavities, the concentration of vacancies occurred in the crystal must be reduced. Therefore, it is necessary to control the pulling rate to be at or in the vicinity of the critical pulling rate for the occurrence of the ring-shaped OSF region at which the V/G ratio is relatively small.

By means of this method, either single crystals completely free of grown-in defects in which dislocation clusters and COPs do not exist over the entire crystal radial direction, or single crystals quasi free of grown-in defects in which a size of COPs is limited to 0.1 µm or less, can be pulled out at a higher pulling rate and in a much broader range of pulling rate (margin) than those in the prior art, thereby they can be grown efficiently and stably.

Here, qualitatively, the "the vicinity of the critical pulling rate" refers to a pulling rate at which a crystal completely free of grown-in defects and not containing dislocation clusters or COPs over the entire crystal radial direction can be obtained, and corresponds to B'-C' in FIG. 4. However, if COPs are allowed to occur having a size limited to 0.1 µm or less, the pulling rate may be increased somewhat more than this.

Quantitatively, when the critical pulling rate is defined as Vo, the pulling rate is approximately 1.7 times the critical pulling rate (1.7 Vo); however density and size of COPs depend on V/G and a cooling rate at near 1100° C., as well as a thermal environment of a CZ furnace. Therefore, "the vicinity of the critical pulling rate" cannot be unambiguously determined. At a pulling rate lower than this range, dislocation clusters occur, and at a higher pulling rate, large COPs having a size of more than 0.1 µm and oxygen precipitate nuclei which are stable at high temperatures appear. And in the case in which the hydrogen concentration becomes relatively high, massive cavities also occur.

With regard to an amount of added hydrogen gas, if the amount is inadequate, effect of raising the critical pulling rate is insufficient, and if the amount is too great, there is a danger of combustion and detonation when air leaks into the furnace. Therefore, a lower limit is preferably 0.1 volume percent or greater, and in particular, more preferably 3 volume percent or more. When the amount is 0.1% or less, there is almost no hydrogen effect, and when the amount is 0.1% or greater and less than 3%, there is some hydrogen effect; however the effect is insufficient. An upper limit is preferably a hydrogen concentration (approximately 10 volume percent) determined by a dilution limit in relation to a used inert gas or less, and in particular, more preferably 8 volume percent or less. In this case, even if air leaks into the furnace, there would be no combustion, and safe operation would be possible.

A method for manufacturing a silicon wafer of the present invention includes: obtaining a wafer from a silicon single crystal which is manufactured by the method for manufacturing a silicon single crystal of the present invention and has high quality and is manufactured economically. Both the quality and the low manufacturing costs of silicon wafers can be simultaneously achieved to a high degree.

As stated above, when silicon wafers cut from the crystal are wafers quasi free of grown-in defects and containing COPs having a size of 0.1 µm or less, it is preferable that COPs be eliminated in a portion of the wafer from a surface to a depth of 1 µm or greater by subjecting the wafer to a COP-elimination annealing such as annealing at 1100 to 1200° C. for 1 hour or longer in hydrogen or argon.

Also, as described above, wafers obtained from single crystals completely free of grown-in defects or wafers obtained from single crystals quasi free of grown-in defects can be used as a PW (Polished Wafer, mirror-polished wafer), and in addition can be used as a SIMOX type SOI wafer or as an active-layer side wafer for a bonded type SOI substrate.

When the crystal is pulled out at or in a vicinity of a critical pulling rate by using a hot-zone structure in which a temperature gradient Gc in a center portion of the crystal is less than a temperature gradient Ge in a peripheral portion of the crystal and by which the OSF occurrence region becomes a V-shape pointed downward in a vertical cross-section of a single crystal grown while gradually lowering the pulling rate, even if hydrogen doping is conducted, the objects of the present invention are not attained as follows.

Also, in the case of Ge>Gc, due to the hydrogen effect, the critical pulling rates Vo, Vc at which the ring-shaped OSF occurrence region and COPs begin to occur in the center portion of the crystal are increased, and the critical pulling rate Vd at which dislocation clusters begin to occur in the portion of the crystal is lowered. Hence even in the case of Ge>Gc, when the two temperature gradients are comparatively close, there are possibilities in which a crystal completely free of grown-in defects and free of COPs and dislocation clusters can be obtained; however the pulling rate margin is extremely narrow compared with the case of Ge≦Gc, thereby defect-free crystals cannot be manufactured stably. Also, in the case of Ge>Gc and in which the difference between Ge and Gc is large, even if hydrogen is added, a pulling rate margin at which defect-free crystals can be manufactured is not obtained.

BEST MODE FOR CARRYING OUT THE INVENTION

Figure 7:
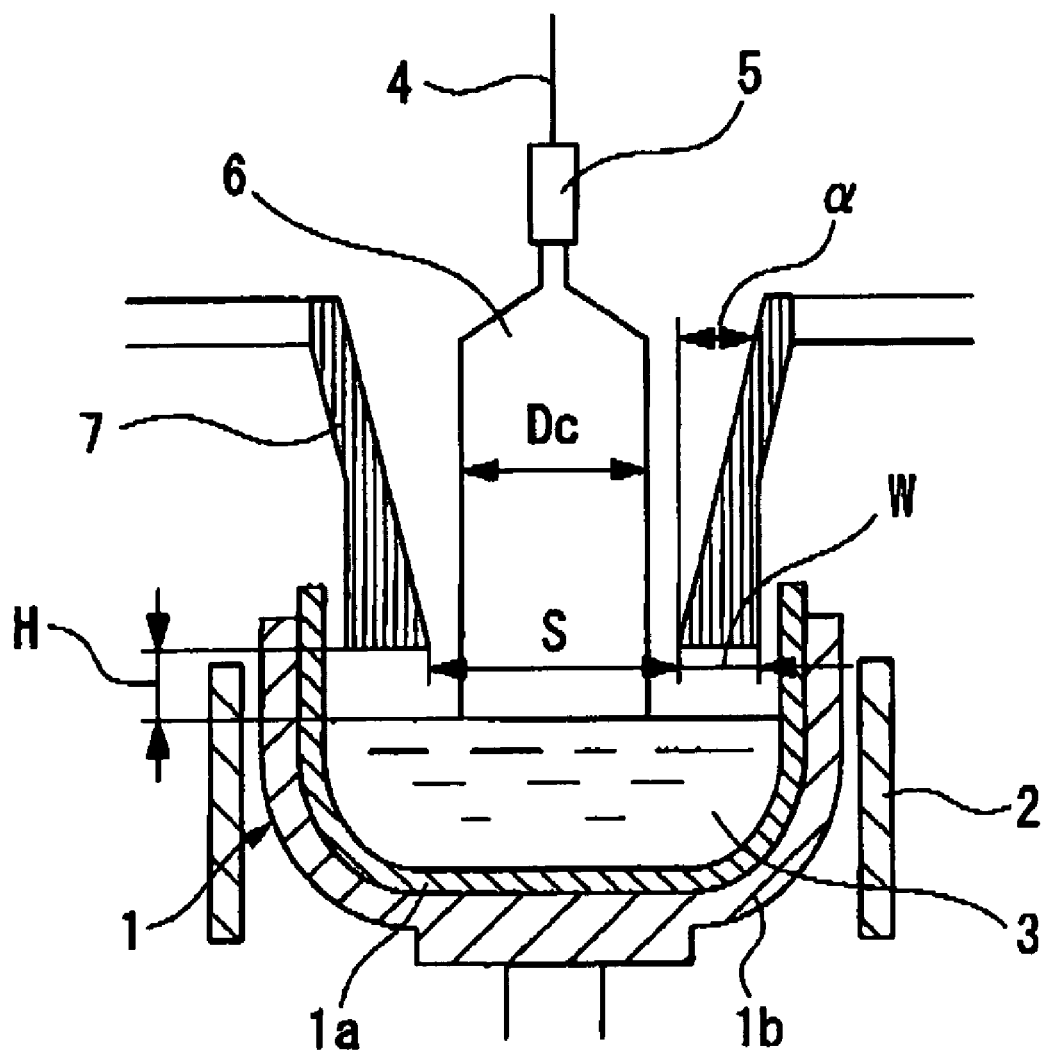
FIG. 7 is a vertical cross-sectional view of a CZ pulling furnace appropriate for implementing a method for manufacturing a silicon single crystal of the present invention.

Embodiments of the present invention are explained below as referring to the drawings. FIG. 7 is a vertical cross-sectional view of a CZ furnace suitable for implementing a method for manufacturing a silicon single crystal of the present invention.

First, structure of the CZ furnace is explained.

The CZ furnace includes a crucible 1 positioned in a center of an interior of the furnace, and a heater 2 positioned around the crucible 1. The crucible 1 has a dual structure in which a quartz crucible 1a holding a raw material melt 3 inside is supported by a graphite crucible 1b positioned outside, and which is driven in rotation and vertical motion by a support shaft called a pedestal. Above the crucible 1 is provided a circular-shaped heat shield 7. The heat shield 7 has an outer shell made of graphite inside which graphite felt is filled up. An inner surface of the beat shield 7 is a tapered surface with an inner diameter gradually decreasing from an upper edge to a lower edge. An upper outer surface of the heat shield 7 is a tapered surface corresponding to the inner surface, and a lower outer surface is formed as substantially a straight surface with a thickness of the heat shield 7 increasing gradually downward.

The CZ furnace is an apparatus for growing single crystals having a diameter of 200 mm. Using this apparatus, single crystals can be grown with a target diameter of for example 210 mm, and with a body length of for example 1200 mm. By means of the heat shield 7, a hot zone structure is formed such that the temperature gradient Gc in the center portion of the crystal is equal to or greater than the temperature gradient Ge in the peripheral portion of the crystal. An example of the specifications of the heat shield 7 is as follows. An outer diameter of a portion placed into the crucible is for example 470 mm; a smallest inner diameter S at a lowermost end is for example 270 mm; a width W in a radial-direction is for example 100 mm; and a inclination of the inner surface which is an inverted cone, with a vertical direction is for example 21°. Also, an inner diameter of the crucible 1 is for example 550 mm, and a height H of a lower end of the heat shield 7 from a melt surface is for example 60 mm.

When pulling out a crystal using a single crystal growth apparatus having the above cross-sectional structure, a temperature gradient in an axial direction from a melting point to 1370° C. is 3.0 to 3.2° C./mm in the center portion of the crystal (Gc), and is from 2.3 to 2.5° C./mm in the peripheral portion (Ge), so that Gc/Ge is approximately 1.3. This state changes hardly at all even if the pulling rate is changed.

Next, a method for setting operating conditions to grow a crystal free of grown-in defects is explained.

First, in order to ascertain tolerance ranges for hydrogen concentrations and for pulling rates at which defect-free crystals can be obtained, hydrogen concentrations are set to mixing ratios of 0, 0.1, 3, 5, 8, and 10 volume %, and under each of these conditions single crystals are grown at the target diameter, for example 210 mm.

That is, for example 130 kg of high-purity silicon polycrystal is loaded into the crucible, and p-type (B, Al, Ga, or similar) or n-type (P, As, Sb, or similar) dopant is added so as to obtain a desired electrical resistivity of the single crystal for example, 10 Ω-cm. The interior of the apparatus is filled with argon at a reduced pressure of 10 to 200 Torr, and hydrogen is added at the above prescribed mixing ratios of 10 volume percent or less with respect to the argon.

Next, the heater 2 is used to heat and melt the silicon resulting in the melt 3. Then a seed crystal mounted in a seed chuck 5 is immersed in the melt 3, and while rotating the crucible 1 and the pulling shaft 4, a crystal pulling is performed. A crystal direction is one among {100}, {111}, or {110}; after performing necking to eliminate dislocations, the shoulder is formed, and a target body diameter is obtained.

When the body length is reached for example 300 mm, the pulling rate is adjusted to a sufficiently larger value than the critical pulling rate, such as for example 1.0 mm/min, and then the pulling rate is decreased at a substantially constant rate to the pulling length so that the pulling rate becomes smaller than the critical pulling rate, for example 0.3 mm/min, when the body length reaches for example 600 mm. Thereafter the crystal is grown to a body length of for example 1200 mm at this pulling rate, tailing is performed under normal conditions, and the crystal growth ends.

In this way, single crystals grown at different hydrogen concentrations are vertically divided along the pulling shaft, plate-shaped specimens are prepared including a vicinity of the pulling axis, and Cu decoration is performed in order to observe grown-in defect distributions. First, the various samples are immersed in a copper sulfate solution, followed by natural drying, and then heat treatment at 900° C. for 20 minutes in a nitrogen atmosphere. Then the samples were immersed in an HF/HNO$_3$ mixed solution so as to remove the Cu silicide layer on the sample surface, and after removing several tens of microns of surface material by etching, X-ray topography was used to investigate positions of the ring-shaped OSF and defect region distributions. Further, the COP density of the sliced samples was investigated using for example the OPP method, and the dislocation cluster density was determined using for example the Secco etching method.

Figure 1:
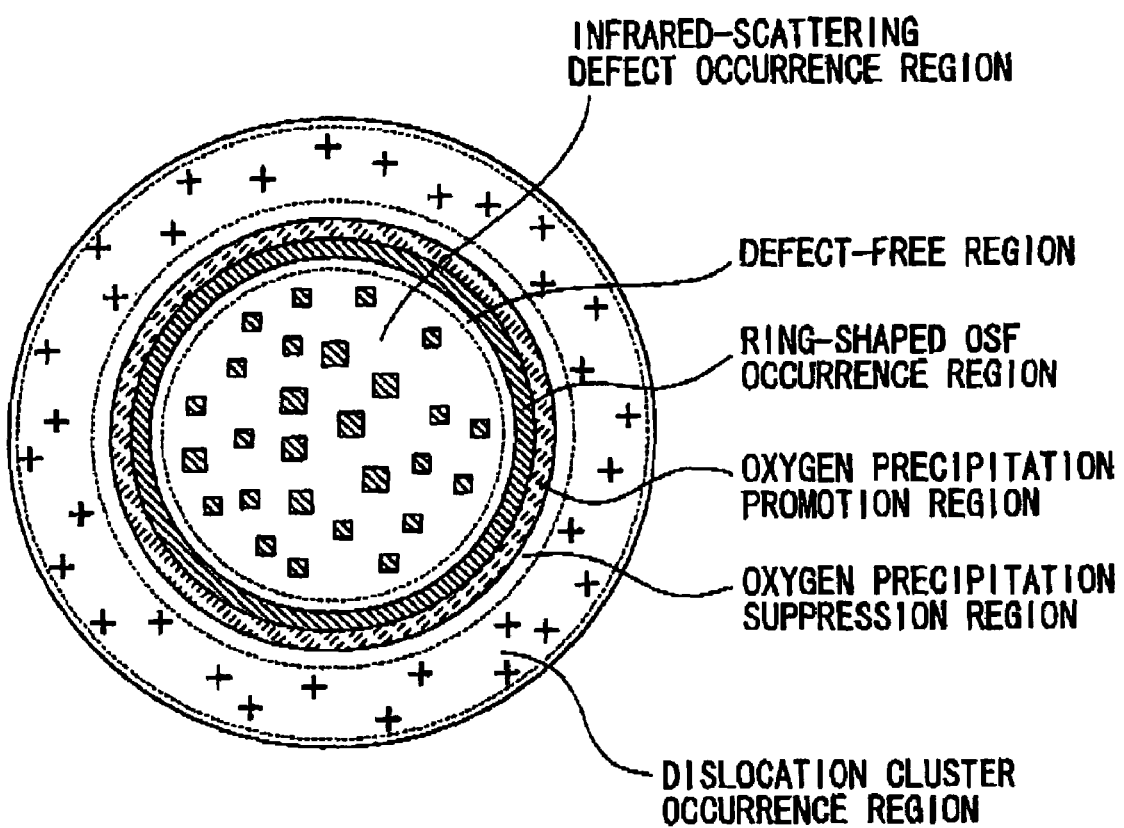
FIG. 1 is a defect distribution diagram in a crystal radial direction.
Figure 2:
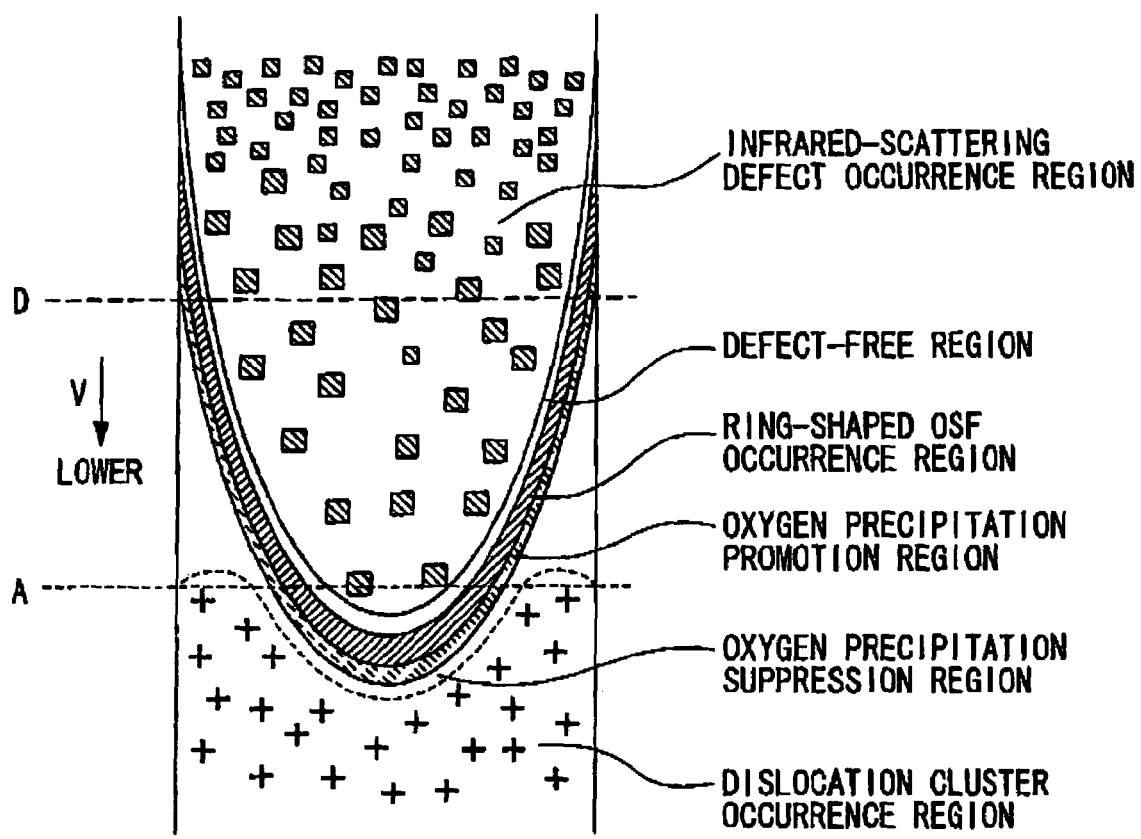
FIG. 2 is a defect distribution diagram in a vertical cross-section of a single crystal grown while gradually lowering a pulling rate, and the single crystal is grown under condition in which temperature gradient Gc in a center portion of the crystal is smaller than temperature gradient Ge in a peripheral portion of the crystal.
Figure 3:
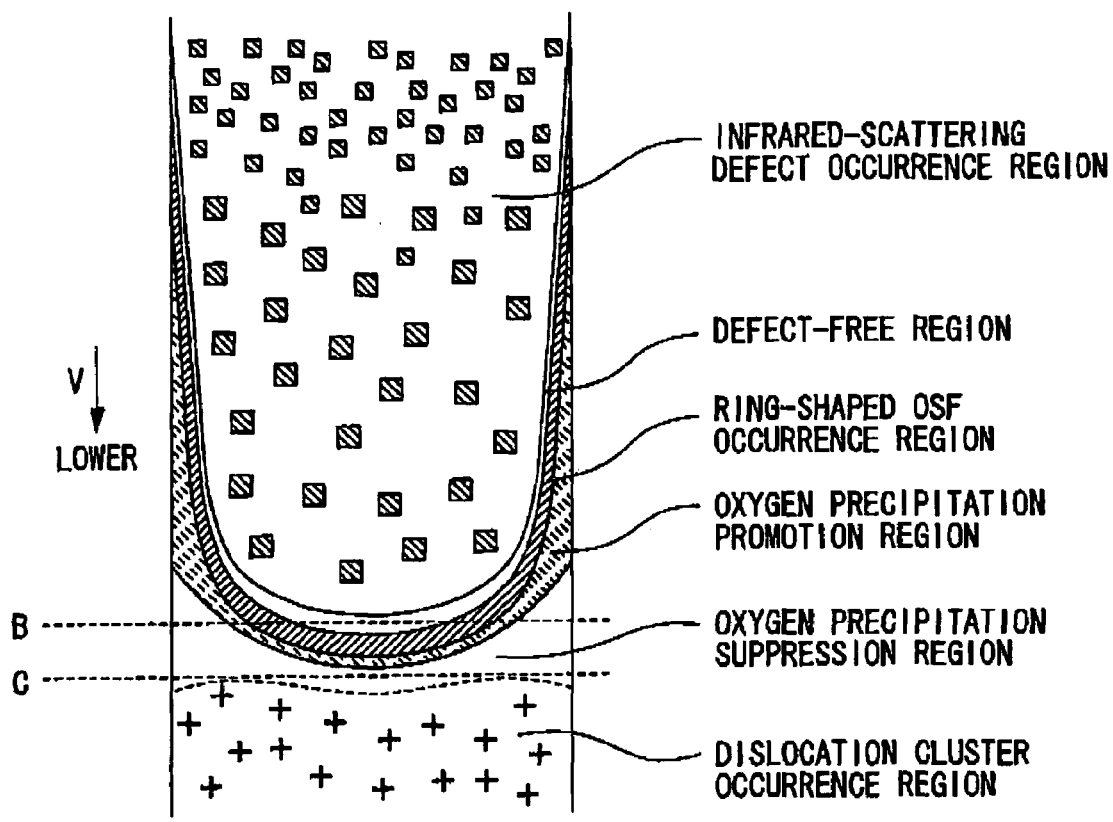
FIG. 3 is a defect distribution diagram in a vertical cross-section of a single crystal grown while gradually lowering the pulling rate, and the single crystal is grown under condition in which the temperature gradient Gc in the center portion of the crystal is equal to or greater than the temperature gradient Ge in the peripheral portion of the crystal.
Figure 4:
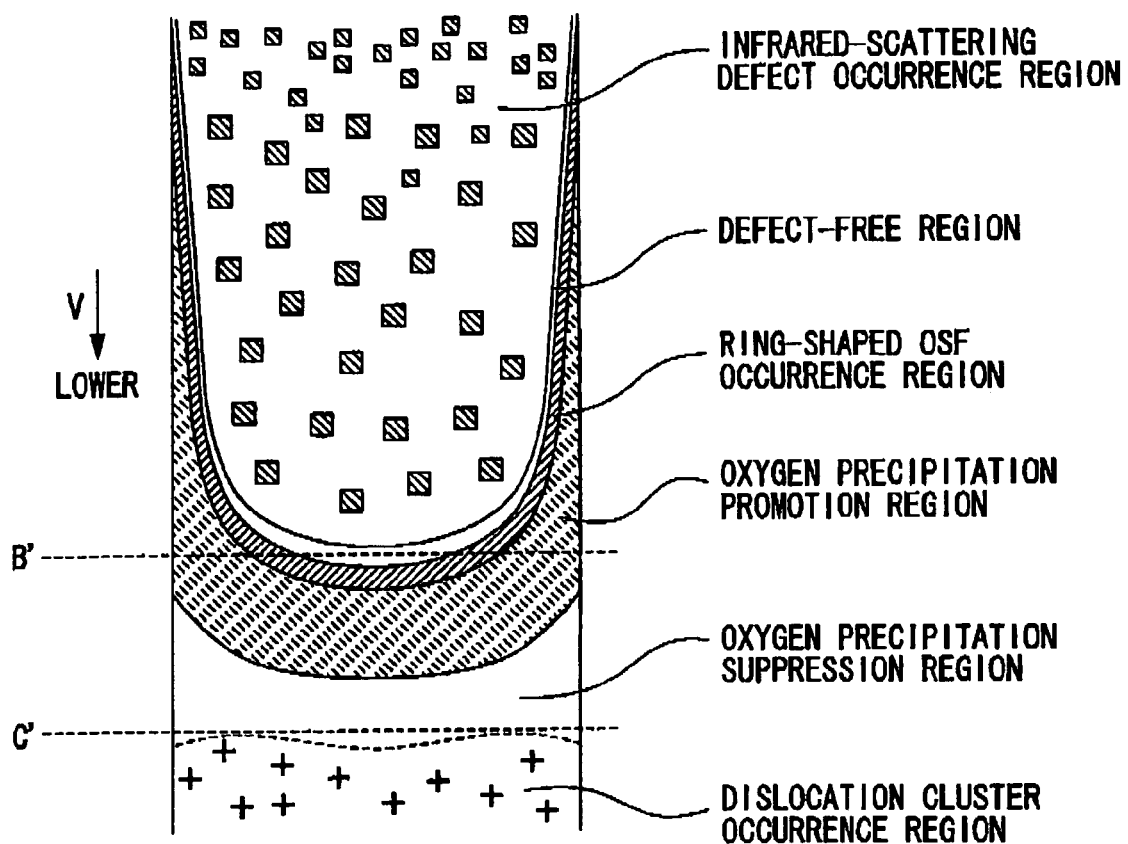
FIG. 4 is a defect distribution diagram in a vertical cross-section of a single crystal grown while gradually lowering the pulling rate, and the single crystal is grown under condition in which the temperature gradient Gc in the center portion of the crystal is equal to or greater than the temperature gradient Ge in the peripheral portion of the crystal and hydrogen is doped.
Figure 5:
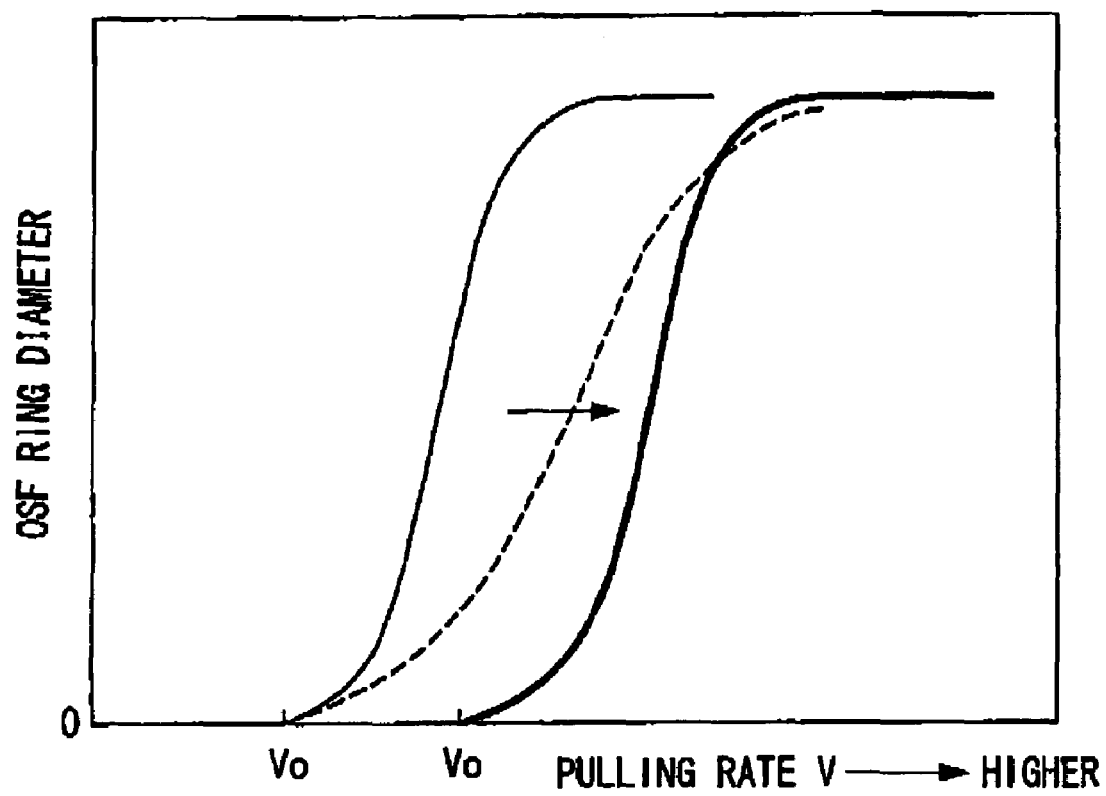
FIG. 5 is a graph showing a degree of influence of defect distributions on a relation between the pulling rate and OSF ring diameter.
Figure 6:
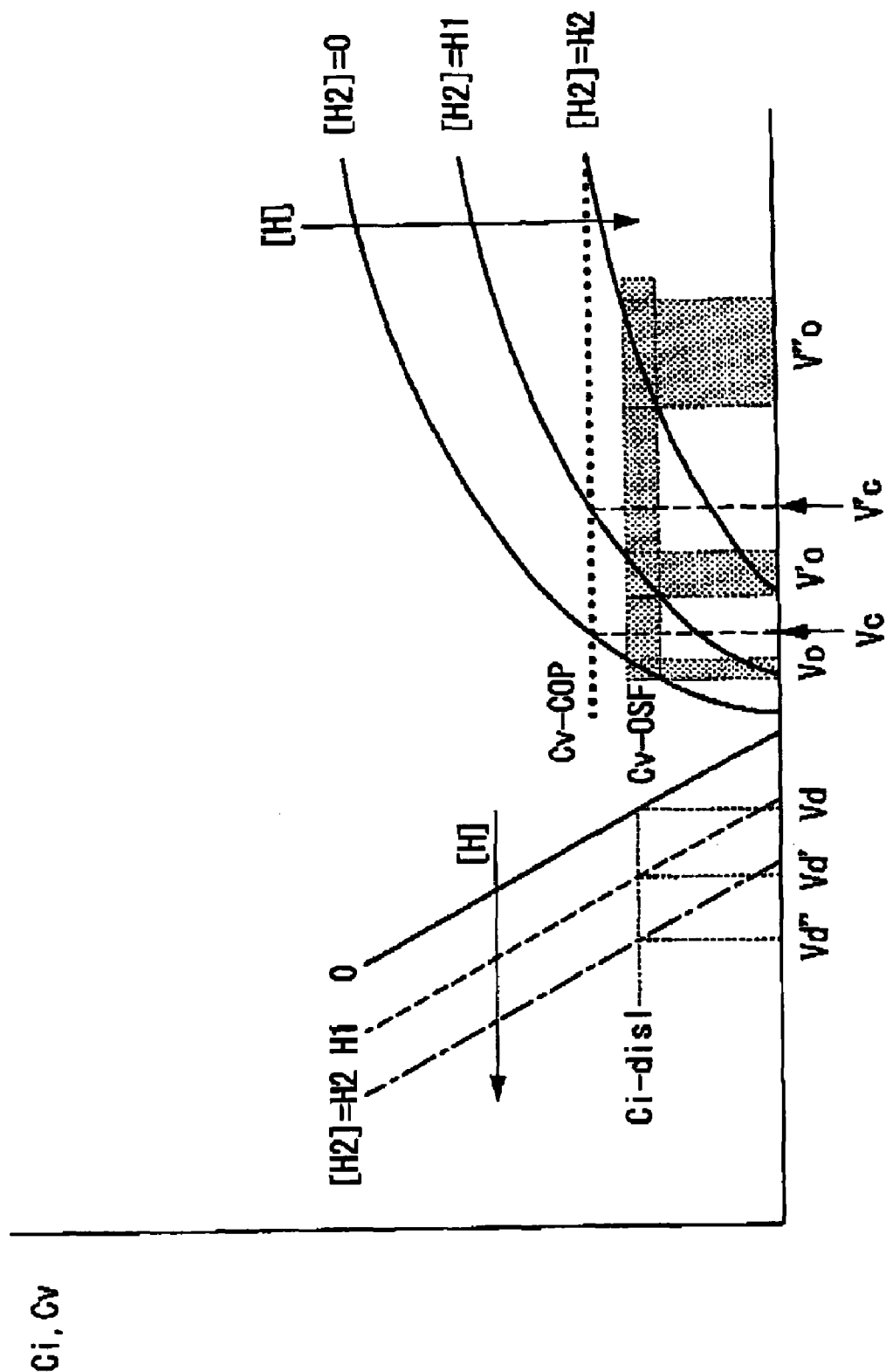
FIG. 6 is a graph showing an influence of V/G on a point defect concentration and a condition for occurrence of various defect regions, and showing a shift of critical V/G due to occurrence of defects caused by hydrogen doping.

As shown in FIG. 3, the crystal grown using such a single crystal pulling apparatus in which Ge/Gc≧1 is satisfied had a defect distribution such that the ring-shaped OSF was in a U-shape slate, and as the hydrogen concentration rose, a defect-free portion expanded to B'-C' as shown in FIG. 4, and the range of pulling rate (margin) at which defect-free crystals were obtained was expanded.

Figure 8:
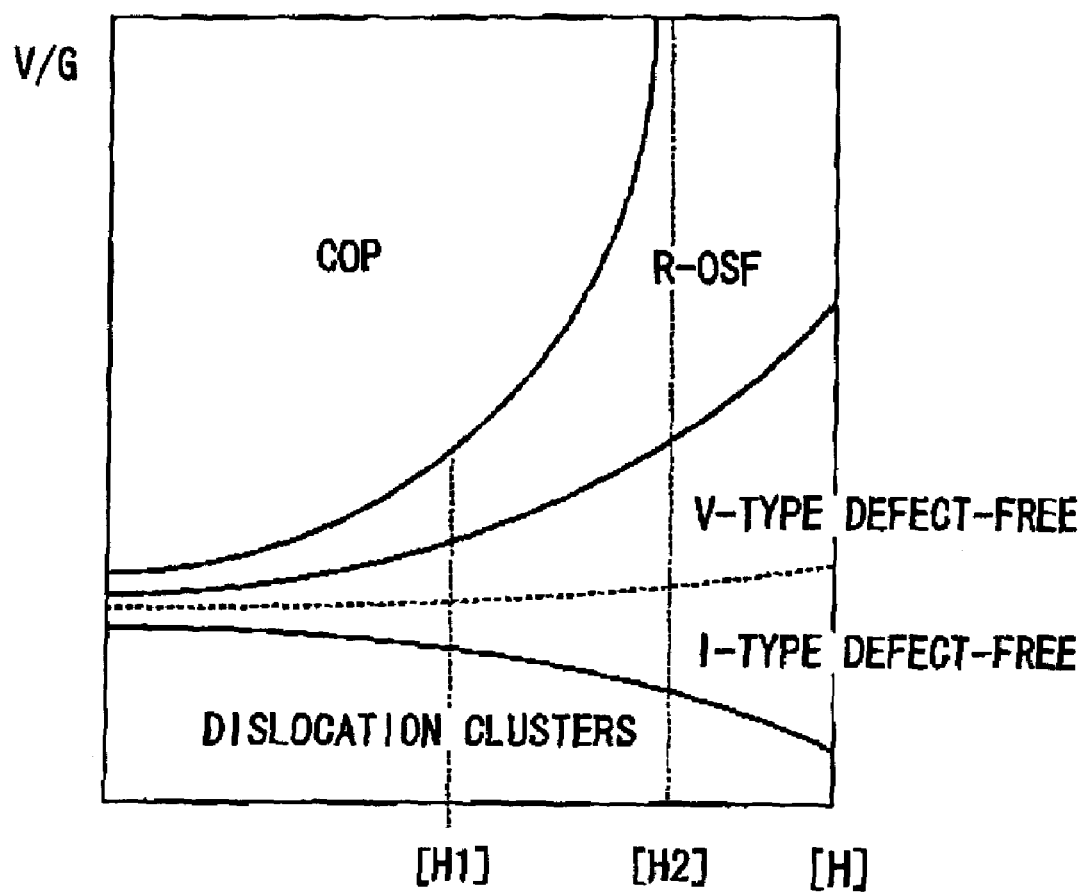
FIG. 8 is a graph showing various defect occurrence regions in a relation between V/G and hydrogen concentration, and showing an expansion of V/G regions due to occurrence of defects caused by hydrogen doping

By means of the above pulling experiments, the COP region, ring-shaped OSF region, V-type and I-type grown-indefect-free regions, dislocation cluster region, and the similar in the relation between V/G and the hydrogen concentration (FIG. 8) were obtained.

Figure 9:
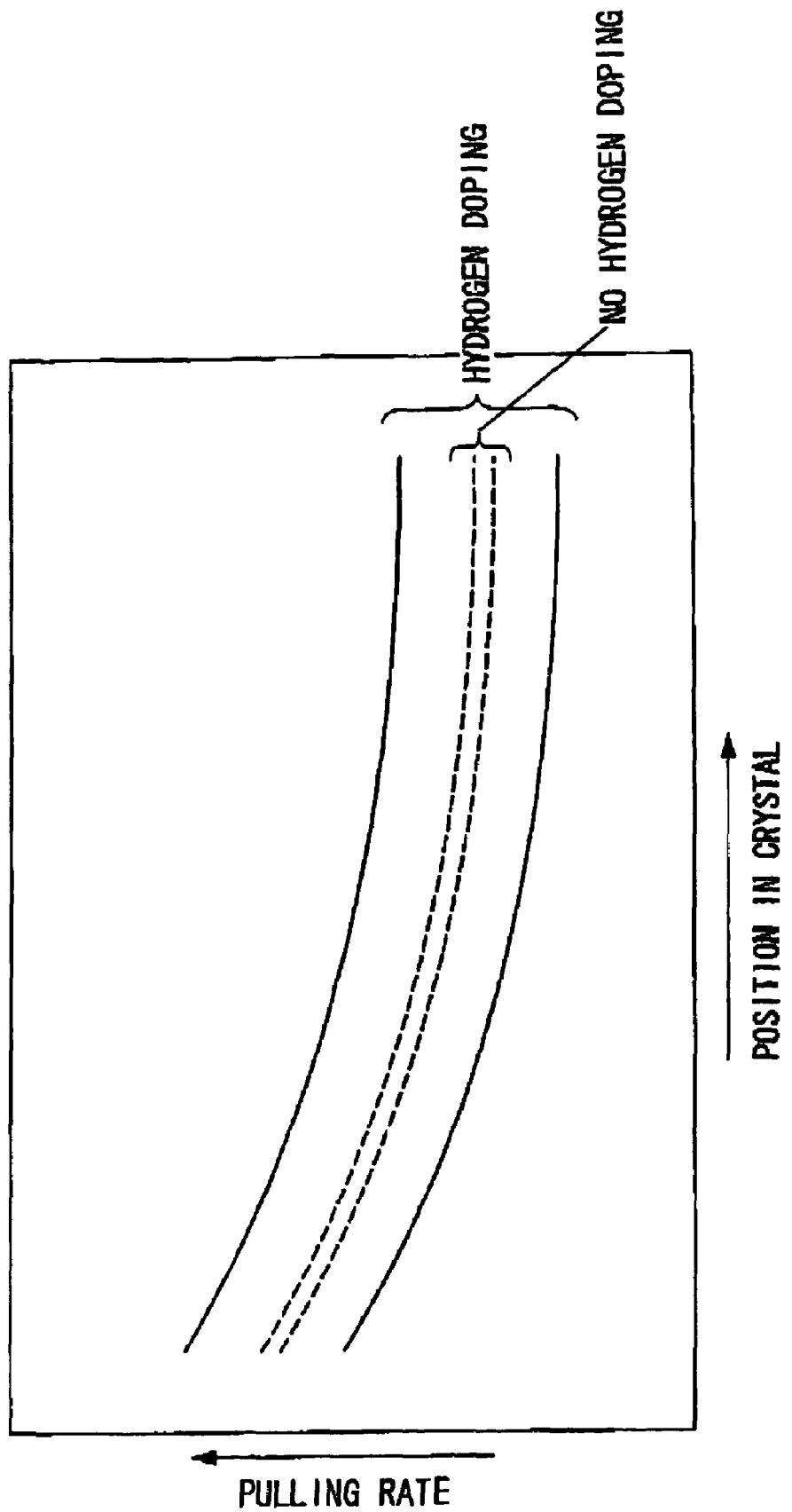
FIG. 9 shows a relation between a position in the crystal and a range of pulling rate (margin) in which a grown-in-defect-free region is obtained.

By changing a position range in which the pulling rate is varied among several various position ranges, such as from 300 mm to 600 mm, from 500 mm to 800 mm, and from 700 mm to 1000 mm, the relation between the range of pulling rate (margin) at which crystals free of grown-in defects are obtained and the position in the axial-direction of the crystal is obtained (FIG. 9). From the figure, the operating conditions to obtain crystals free of grown-in defects can be set.

Next, methods for manufacturing various wafers are explained.

By setting a pulling rate within a range of pulling rate indicated by the solid lines in FIG. 9 in the corresponding position in the crystal, a crystal completely free of grown-in defects from top to bottom can be grown.

Then, by doping hydrogen, the pulling range (margin) in which a crystal free of grown-in defects is obtained, which is indicated by the solid lines in FIG. 9 is significantly expanded compared with that indicated by the dotted lines for conventional undoped crystals. Therefore the production yield of crystals free of grown-in defects is increased drastically.

In the case in which the pulling rate is set to an upper limit indicated by a solid line in FIG. 9 or greater and equal to or less than 1.7 times the upper limit, grown-in defects are not completely eliminated, but a crystal can be grown containing COPs of size 0.1 μm or less. By subjecting this crystal to annealing in an atmosphere of hydrogen, argon or similar, grown-in defects can be eliminated in the surface region to a depth of 1 μm or more. Moreover, because size of the defects is 0.1 μm or less, COPs can be completely eliminated from the surface layer to a depth of approximately 1 μm by annealing at 1110° C. for approximately two hours. Such a wafer can be used as an ordinary PW (Polished Wafer, mirror-polished wafer) in device manufacture, or can be used as a SOI substrate.

In the present invention, when growing a silicon single crystal in which hydrogen is doped using the Czochralski method, it is not limited whether or not a magnetic field is applied to the melt, and the present invention includes so-called MCZ method in which the magnetic field is applied.

In the present invention, as a SOI substrate in a SIMOX method or in a bonding method, wafers can be used which are manufactured by a technology of doping hydrogen in a silicon single crystal when growing the silicon single crystal by the CZ method so as to completely eliminate COPs, dislocation clusters and other grown-in defects or to reduce sizes of COPs to 0.1 μm or less, and wafers can also be used which are manufactured by the above technology and further annealing in a hydrogen atmosphere or in an argon atmosphere. Since an active layer contains no crystal defects or contains COPs of which size is 0.1 μm or less, these can easily be eliminated by heat treatment, and do not readily become penetrating pinholes. Furthermore, SOI substrates can be provided in which ions implanted in a smart-cut method or SIMOX method are not likely to be scattered and not likely to become defects in a buried oxide layer.

Also, since the pulling rate margin for growing crystals free of grown-in defects is broadened by a hydrogen doping, production yields for the crystals free of grown-in defects are greatly increased, manufacturing costs of SOI substrates can be dramatically reduced.

In a method for manufacturing a SOI substrate of the present invention, first a silicon single crystal rod doped with hydrogen is grown by the CZ method under the manufacturing conditions indicated in FIG. 9, and then the single crystal rod is sliced and processed, thereby silicon single crystal wafers doped with hydrogen are manufactured.

In detail, the silicon single crystal rod containing hydrogen and oxygen in the desired concentrations is obtained by the CZ method, and the silicon single crystal rod is subjected to slicing using an ID saw, wire saw or other slicing apparatus, and then beveling, lapping, etching, polishing, and performing other normal processes so as to obtain silicon single crystal wafers. In addition to these processes, cleaning and various other processes are performed; an order of the processes may be altered, some processes may be omitted, and otherwise applied as appropriate according to the purpose.

Next, the silicon single crystal wafer thus obtained is used as at least an active-layer side (device fabrication side) wafer, and a SOI substrate is manufactured by the SIMOX method or the bonding method.

Manufacturing conditions are not limited for manufacturing a SOI substrate by the SIMOX method in particular other than using the above-described hydrogen-doped silicon single crystal wafer, or the above wafer subjected to further annealing in the hydrogen or argon atmosphere. When manufacturing a SIMOX substrate, in an oxygen ion implantation condition, accelerating voltage of 180 keV to 200 keV is normally applied; however voltages higher or lower than this range may be applied. An oxygen ion dose of approximately $4 \times 10^{17}$ cm$^{-2}$ or a dose of at least $1.0 \times 10^{18}$ cm$^{-2}$ is desirable; however doses outside this range may also be doped. Annealing conditions of 1300° C. or higher are desirable in order to obtain a good-quality buried oxide film; however temperatures lower than the range may be applied. Atmosphere employed in annealing may be oxidizing or non-oxidizing.

Because a hydrogen-doped wafer free of void defects is used, a pinhole density in the SOI buried oxide layer manufactured by the SIMOX method in this way is significantly lower than that when using a normal silicon wafer not doped with hydrogen.

When manufacturing a SOI substrate by the bonding method, an active-layer side wafer and a base wafer are prepared as unprocessed wafers. A hydrogen-doped silicon single crystal wafer grown by the CZ method as described above is used as at least the active-layer side wafer. Of course hydrogen-doped wafers may be used as both of the wafers.

Among the silicon single crystal substrates thus prepared, the active-layer side wafer is subjected to a heat treatment so as to form an oxide film in a surface thereof. This heat treatment is performed at a high temperature of for example 1000° C. or higher. In this case, the oxide film may be formed in the base wafer, or the oxide films may be formed in both wafers.

Next, the active-layer side wafer in which the oxide film is formed and the base wafer are brought into close contact. Heat treatment is applied in an oxidizing atmosphere so as to bond the active-layer side wafer and the base layer strongly together for obtaining a bonded substrate. At this time, an oxide film is also formed on an outer surface of the bonded SOI substrate.

As conditions of the heat treatment for bonding the two wafers, for example, heat treatment may be performed in an atmosphere containing oxygen or water vapor at a temperature of 400° C. to 1200° C., and more preferably 900° C. or higher. By performing the heat treatment at a high temperature in the above range, the two wafers can be bonded strongly together.

As described above, the hydrogen-doped substrate either free of grown-in defects or in which a size of contained COPs is small is used as at least the active-layer side substrate, thereby effects of grown-in defects to degrade device electrical characteristics are eliminated.

Finally, a surface of the active-layer side wafer is subjected to polishing or grinding so as to reduce a thickness to a desired value, thereby a bonded SOI substrate having a high-quality active layer can be manufactured. In particular, since when the active layer is reduced to a thickness of 1 μm or less, grown-in defects tend to form penetrating pinholes, the method of the present invention is especially advantageous.

In reducing the thickness of the active-layer side wafer, polishing, grinding, etching, or other techniques may be used; however techniques for reducing the thickness are not limited to these techniques. In particular, the present invention is also advantageous for other techniques which have a lot of attention in recent years as a method for fabricating a SOI layer thin film, such as a vapor phase etching method, or a Smart Cut method in which a wafer is ion-implanted and bonded and then separated In the above embodiments, the case was explained in which two silicon wafers are bonded to fabricate a SOI substrate; however the present invention is also advantageous for a case in which the hydrogen-doped CZ silicon wafer of the present invention is bonded with an insulating substrate such as quartz, silicon carbide, silicon nitride, alumina, sapphire, or other ceramic materials so as to fabricate a bonded SOI substrate.

INDUSTRIAL APPLICABILITY

In the above explanations, the silicon wafers of the present invention are either high-quality wafers completely free of defects and which contain no dislocation clusters or COPs over the entire crystal radial direction in the as-grown state or high-quality wafers quasi free of defects in which a size of COPs is limited to 0.1 μm or smaller. Moreover, since the wafers are manufactured by doping hydrogen in a crystal growth process, a high pulling rate can be secured, thereby high productivity and low manufacturing costs are realized. And by using hydrogen-doped silicon single crystal wafers in a fabrication of a SOI substrates, SOI substrates in which a size of crystal defects is small in the SOI layer and few pinholes are formed can be obtained at low manufacturing costs and with high productivity.

The method for manufacturing a silicon wafer of the present invention employs as a starting material, a crystal completely free of defects or a crystal quasi free of defects, and the crystals are grown at a high pulling rate by doping hydrogen in the crystal growth process. Therefore, high-quality silicon wafers can be manufactured at low cost.

Furthermore, in a method for growing a silicon single crystal of the present invention, when growing a crystal completely free of defects or quasi free of defects, the hydrogen doping is conducted so as to raise a critical pulling rate, so that high-quality silicon single crystals can be manufactured with good productivity and at low cost.

In particular, the present invention is advantageous for the manufacture of thin SOI substrates in which a SOI layer has a thickness of 1 micron or less, in which crystal defects and pinholes in the SOI layer in particular pose problems.

The invention claimed is:

1. A method for growing a silicon single crystal, the method comprising:
   growing a silicon single crystal by the CZ method by using a hot zone structure in which a temperature gradient Gc in a center portion of the crystal is greater than a temperature gradient Ge in a peripheral portion of the crystal, while supplying an inert gas including hydrogen of more than 3 volume % to 8 volume % or less to an interior of a pulling furnace,
   wherein in accordance with the including of hydrogen of more than 3 volume % to 8 volume % or less, a pulling rate at which a vacancy-dominant region of COP occurrence vanishes over the entire crystal radial direction is shifted toward higher pulling rates than that in the case where hydrogen is not included, and a pulling rate at which an interstitial-silicon-dominant region of dislocation cluster occurrence appears in a portion of the crystal radial direction is shifted toward lower pulling rates than that in the case where hydrogen is not included, thereby, a range of pulling rate at which crystals free of grown-in defects are grown is expanded,
   wherein the growing of the silicon single crystal is conducted under conditions where the pulling rate at which the vacancy-dominant region of COP occurrence vanishes over the entire crystal radial direction is taken to be an upper limit, and the pulling rate at which the interstitial-silicon-dominant region of dislocation cluster occurrence appears in a portion of the crystal radial direction is taken to be a lower limit, so as to grow the silicon single crystal which is completely free of grown-in defects and does not contain COPs and dislocation clusters over an entire crystal radial direction, and
   a temperature gradient in an axial direction from a melting point of silicon to 1370° C. is 3.0 to 3.2° C./mm in the center portion of the crystal (Gc), and is from 2.3 to 2.5° C./mm in the peripheral portion (Ge).

2. A method for manufacturing a silicon wafer, the method comprising: obtaining a wafer from a silicon single crystal grown by the method for growing a silicon single crystal according to claim 1.

* * * * *